(12) United States Patent
Kim et al.

(10) Patent No.: US 12,413,247 B2
(45) Date of Patent: Sep. 9, 2025

(54) CODE GENERATION METHOD, ERROR CORRECTION CODE GENERATION APPARATUS, AND STORAGE MEDIUM STORING INSTRUCTIONS TO PERFORM CODE GENERATION METHOD

(71) Applicant: Research Business Foundation SUNGKYUNKWAN UNIVERSITY, Suwon-si (KR)

(72) Inventors: Jungrae Kim, Suwon-si (KR); Dong Whee Kim, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 5 days.

(21) Appl. No.: 18/506,336

(22) Filed: Nov. 10, 2023

(65) Prior Publication Data
US 2024/0429942 A1    Dec. 26, 2024

(30) Foreign Application Priority Data
Jun. 20, 2023   (KR) ........................ 10-2023-0078765

(51) Int. Cl.
*H03M 13/11*   (2006.01)
*H03M 13/00*   (2006.01)
*H03M 13/15*   (2006.01)

(52) U.S. Cl.
CPC ... *H03M 13/1174* (2013.01); *H03M 13/1515* (2013.01); *H03M 13/159* (2013.01); *H03M 13/616* (2013.01)

(58) Field of Classification Search
CPC ......... H03M 13/1174; H03M 13/1515; H03M 13/159; H03M 13/616
See application file for complete search history.

(56) References Cited

U.S. PATENT DOCUMENTS

| | | | | |
|---|---|---|---|---|
| 4,862,463 A | * | 8/1989 | Chen | G06F 11/1028 714/767 |
| 8,516,347 B1 | * | 8/2013 | Li | H03M 13/6331 714/778 |
| 2009/0006900 A1 | * | 1/2009 | Lastras-Montano | G06F 11/1044 714/42 |

(Continued)

*Primary Examiner* — Albert Decady
*Assistant Examiner* — Enamul M Kabir
(74) *Attorney, Agent, or Firm* — NSIP Law

(57) ABSTRACT

There is provided a code generation method. The method comprises extracting columns corresponding to the number of symbols of a codeword from a parity check matrix of an error correction code; generating a shortened parity check matrix for the error correction code on the basis of the columns corresponding to the number of symbols of the codeword; checking whether the shortened parity check matrix includes an independent nonzero syndrome for each of a single symbol error and a double error; and generating a parity check matrix for a correction of the single symbol error corresponding to the number of bits of the shortened parity check matrix and a correction of the double error corresponding to the number of bits of the shortened parity check matrix if the shortened parity check matrix includes the independent nonzero syndrome for each of the single symbol error and the double error.

20 Claims, 7 Drawing Sheets

(56) References Cited

U.S. PATENT DOCUMENTS

| | | | | |
|---|---|---|---|---|
| 2009/0158129 A1* | 6/2009 | Myung | ............. | H03M 13/6393 |
| | | | | 714/752 |
| 2010/0269009 A1* | 10/2010 | Okamura | .......... | H03M 13/6527 |
| | | | | 714/752 |
| 2018/0343018 A1* | 11/2018 | Chen | ..................... | H03M 13/07 |
| 2021/0194508 A1* | 6/2021 | Kim | .................... | G06F 11/1048 |
| 2023/0146904 A1* | 5/2023 | Lee | ....................... | H03M 13/17 |
| | | | | 714/785 |

* cited by examiner

$$\alpha^0 \; \alpha^1 \; \alpha^2 \; \cdots \; \alpha^{254}$$
$$\alpha^0 \; \alpha^2 \; \alpha^4 \; \cdots \; \alpha^{253}$$

FIG.5

$$\begin{matrix} & \text{COLUMN} \\ & \text{EXTRACTION} \end{matrix} \qquad\qquad\qquad \begin{matrix} & \text{UNIT} \\ & \text{MATRIX} \end{matrix}$$

$$\begin{bmatrix} \alpha^0 & \alpha^1 & \alpha^2 & \cdots & \alpha^{253} & \alpha^{254} & \alpha^0 & 0 \\ \alpha^0 & \alpha^2 & \alpha^4 & \cdots & \alpha^{253} & \alpha^{253} & 0 & \alpha^0 \end{bmatrix} \Rightarrow \begin{bmatrix} \alpha^A & \alpha^B & \alpha^C & \cdots & \alpha^{AA} & \alpha^{BB} & \alpha^0 & 0 \\ \alpha^{2A} & \alpha^{2B} & \alpha^{2C} & \cdots & \alpha^{2AA} & \alpha^{2BB} & 0 & \alpha^0 \end{bmatrix}$$

$$\alpha^{25}\ \alpha^{39}\ \alpha^{63}\ \alpha^{108}\ \alpha^{141}\ \alpha^{184}\ \alpha^{215}\ \alpha^{230}\ \alpha^0\ 0$$
$$\alpha^{50}\ \alpha^{78}\ \alpha^{126}\ \alpha^{216}\ \alpha^{27}\ \alpha^{113}\ \alpha^{175}\ \alpha^{205}\ 0\ \alpha^0$$

FIG.8

2056 BITS IN CASE OF

COLUMN EXTRACTION $$\begin{bmatrix} \alpha^0 & \alpha^1 & \alpha^2 & \cdots & \alpha^{253} & \alpha^{254} & \alpha^0 & 0 \\ \alpha^0 & \alpha^2 & \alpha^4 & \cdots & \alpha^{253} & \alpha^{253} & 0 & \alpha^0 \end{bmatrix}$$

IN CASE OF 32 BITS $$\Rightarrow \begin{bmatrix} \alpha^{25} & \alpha^{39} & \alpha^0 & 0 \\ \alpha^{50} & \alpha^{78} & 0 & \alpha^0 \end{bmatrix}$$

FIG.9

IN CASE OF 2056 BITS

COLUMN EXTRACTION $$\begin{bmatrix} \alpha^0 & \alpha^1 & \alpha^2 & \cdots & \alpha^{253} & \alpha^{254} & \alpha^0 & 0 \\ \alpha^0 & \alpha^2 & \alpha^4 & \cdots & \alpha^{253} & \alpha^{253} & 0 & \alpha^0 \end{bmatrix}$$

IN CASE OF 32 BITS

UNIT MATRIX $$\Rightarrow \begin{bmatrix} \alpha^{25} & \alpha^{39} & \alpha^0 & 0 \\ \alpha^{50} & \alpha^{78} & 0 & \alpha^0 \end{bmatrix}$$

CODE GENERATION METHOD, ERROR CORRECTION CODE GENERATION APPARATUS, AND STORAGE MEDIUM STORING INSTRUCTIONS TO PERFORM CODE GENERATION METHOD

TECHNICAL FIELD

The present disclosure relates to technology for generating error correction code (ECC).

This work was supported by Institute for Information & communications Technology Promotion (IITP) grant funded by the Korea government (MSIT; Ministry of Science and ICT) (No. 2021-0-00863-003, Development of intelligent in-memory error correction device for highly reliable memory, and No. 2019-0-00421-004, Artificial intelligence graduate school application), National Research Foundation of Korea (NRF) grant funded by the Korea government (MSIT) (No. 2020M3H2A1076786, Industry-academic IoT semiconductor system convergence human resources development center), and Korea Planning & Evaluation of Industrial Technology (KEIT) grant funded by the Korea government (MOTIE; Ministry of Commerce Industry and Energy) (No. 00237136, Development of CXL/DDR5 based memory subsystem solution for A1 accelerator).

BACKGROUND

Error correction code is used to generate a codeword through an encoding process performed on data to be transmitted, and the original data can be obtained after correction of errors through a decoding process performed on the received codeword.

Such error correction code is used not only for communication but also to protect data read/written from/to a memory. Error correction code that guarantees higher reliability has a higher ratio of redundancy bits (parity bits) and requires a longer encoding/decoding time, higher power consumption for encoding/decoding, and increased area burden, and thus it is necessary to appropriately use various types of error correction code in consideration of trade-off between such restrictions.

Among techniques using error correction code, single symbol error correction (SSC) is mainly used in memory controllers that guarantee high reliability. However, single symbol error correction has a limitation in that it cannot correct scattered errors.

SUMMARY

In an embodiment of the present disclosure, a technique for generating error correction code capable of single symbol error correction and double error correction by using a non-zero syndrome for double error correction without adding redundancy bits (parity bits) which are extra bits is proposed.

The aspects of the present disclosure are not limited to the foregoing, and other aspects not mentioned herein will be clearly understood by those skilled in the art from the following description.

In accordance with an aspect of the present disclosure, there is provided a code generation method in an error correction code generation apparatus, the code generation method comprises: extracting columns corresponding to the number of symbols of a codeword from a parity check matrix of an error correction code; generating a shortened parity check matrix for the error correction code on the basis of the columns corresponding to the number of symbols of the codeword; checking whether the shortened parity check matrix includes an independent nonzero syndrome for each of a single symbol error and a double error; and generating a parity check matrix for a correction of the single symbol error corresponding to the number of bits of the shortened parity check matrix and a correction of the double error corresponding to the number of bits of the shortened parity check matrix if the shortened parity check matrix includes the independent nonzero syndrome for each of the single symbol error and the double error.

The generating of the shortened parity check matrix may include setting two rightmost columns of the parity check matrix as a unit matrix.

The code generation method may include determining the checked result for whether the shortened parity check matrix includes the independent nonzero syndrome for each of the single symbol error and the double error, and repeating the extracting columns until it is checked that the shortened parity check matrix includes the independent nonzero syndrome for each of the single symbol error and the double error.

The checking whether the shortened parity check matrix may include the independent nonzero syndrome for each of the single symbol error and the double error includes converting symbols of each column of the shortened parity check matrix into a binary form.

The correction of the double error may satisfy a first condition in which all columns of the parity check matrix are nonzero and different from each other and a second condition in which exclusive bit ORs of arbitrary two columns of the parity check matrix are different from each other and are different from all columns of the parity check matrix.

Each symbol may be composed of 8 bits, and the codeword is composed of 80 bits.

The error correction code may include a Reed-Solomon error correction code.

In accordance with another aspect of the present disclosure, there is provided an error correction code generation apparatus, the apparatus comprises: a memory configured to store one or more instruction; and a processor configured to execute the one or more instructions stored in the memory, wherein the instructions, when executed by the processor, cause the processor to: extract columns corresponding to the number of symbols of a codeword from a parity check matrix of an error correction code; generate a shortened parity check matrix for the error correction code on the basis of the columns corresponding to the number of symbols of the codeword; check whether the shortened parity check matrix includes an independent nonzero syndrome for each of a single symbol error and a double error; and generate a parity check matrix for a correction of the single symbol error corresponding to the number of bits of the shortened parity check matrix and a correction of the double error corresponding to the number of bits of the shortened parity check matrix if the shortened parity check matrix includes the independent nonzero syndrome for each of the single symbol error and the double error.

The processor may be configured to set two rightmost columns of the parity check matrix as a unit matrix when generating the shortened parity check matrix.

The processor may be configured to determine the checked result for whether the shortened parity check matrix includes the independent nonzero syndrome for each of the single symbol error and the double error, and repeatedly extract the columns until it is checked that the shortened parity check matrix includes the independent nonzero syndrome for each of the single symbol error and the double error.

The processor may be configured to convert symbols of each column of the shortened parity check matrix into a binary form.

The correction of the double error may satisfy a first condition in which all columns of the parity check matrix are nonzero and different from each other and a second condition in which exclusive bit ORs of arbitrary two columns of the parity check matrix are different from each other and are different from all columns of the parity check matrix.

Each symbol may be composed of 8 bits, and the codeword is composed of 80 bits.

The error correction code may include a Reed-Solomon error correction code.

In accordance with another aspect of the present disclosure, there is provided an error correction code generation apparatus, the apparatus comprises: an extraction unit configured to extract columns corresponding to the number of symbols of a codeword from a parity check matrix of an error correction code; a generation unit configured to generate a shortened parity check matrix for the error correction code on the basis of the columns corresponding to the number of symbols of the codeword; and a checking unit configured to check whether the shortened parity check matrix includes an independent nonzero syndrome for each of a single symbol error and a double erro, wherein the generation unit is configured to generate a parity check matrix for a correction of the single symbol error corresponding to the number of bits of the shortened parity check matrix and a correction of the double error corresponding to the number of bits of the shortened parity check matrix if the shortened parity check matrix includes the independent nonzero syndrome for each of the single symbol error and the double error.

The generation unit may be configured to set two rightmost columns of the parity check matrix as a unit matrix when generating the shortened parity check matrix.

The extraction unit may be configured to determine the checked result for whether the shortened parity check matrix includes the independent nonzero syndrome for each of the single symbol error and the double error, and repeatedly extract the columns until it is checked that the shortened parity check matrix includes the independent nonzero syndrome for each of the single symbol error and the double error.

The checking unit may be configured to convert symbols of each column of the shortened parity check matrix into a binary form.

In accordance with another aspect of the present disclosure, there is provided a non-transitory computer-readable storage medium storing a computer program, which comprises instructions for a processor to perform a code generation method, the code generation method comprise: extracting columns corresponding to the number of symbols of a codeword from a parity check matrix of an error correction code; generating a shortened parity check matrix for the error correction code on the basis of the columns corresponding to the number of symbols of the codeword; checking whether the shortened parity check matrix includes an independent nonzero syndrome for each of a single symbol error and a double error; and generating a parity check matrix for a correction of the single symbol error corresponding to the number of bits of the shortened parity check matrix and a correction of the double error corresponding to the number of bits of the shortened parity check matrix if the shortened parity check matrix includes the independent nonzero syndrome for each of the single symbol error and the double error.

According to an embodiment of the present disclosure, by providing error correction code capable of single symbol error correction and double error correction without adding redundancy bits, hardware limitations of encoding/decoding devices can be minimized and error correction capability can be improved.

BRIEF DESCRIPTION OF THE DRAWINGS

FIG. 3 is a diagram illustrating an exemplary parity check matrix of an error correction code used in the error correction code generation apparatus 100 according to an embodiment of the present disclosure.

FIG. 4 is a diagram illustrating an unshortened Reed-Solomon error correction code used in the error correction code generation apparatus 100 according to an embodiment of the present disclosure.

FIG. 5 illustrates a case of extracting columns from a parity check matrix of an unshortened Reed-Solomon error correction code through an extraction unit 110 of the error correction code generation apparatus 100 according to an embodiment of the present disclosure and a case of generating a shortened parity check matrix for a Reed-Solomon error correction code through a generation unit 120 as a basis the extracted columns.

FIG. 6 is a diagram illustrating a case in which the symbols in the columns of FIG. 5 are converted into a binary form.

FIG. 7 is a diagram illustrating a parity check matrix for single symbol error correction and double error correction generated by the error correction code generation apparatus 100 according to an embodiment of the present disclosure.

FIGS. 8 to 12 are diagrams illustrating a code generation process for single symbol error correction and double error correction in the error correction code generation apparatus 100 according to an embodiment of the present disclosure.

DETAILED DESCRIPTION

Figure 1:
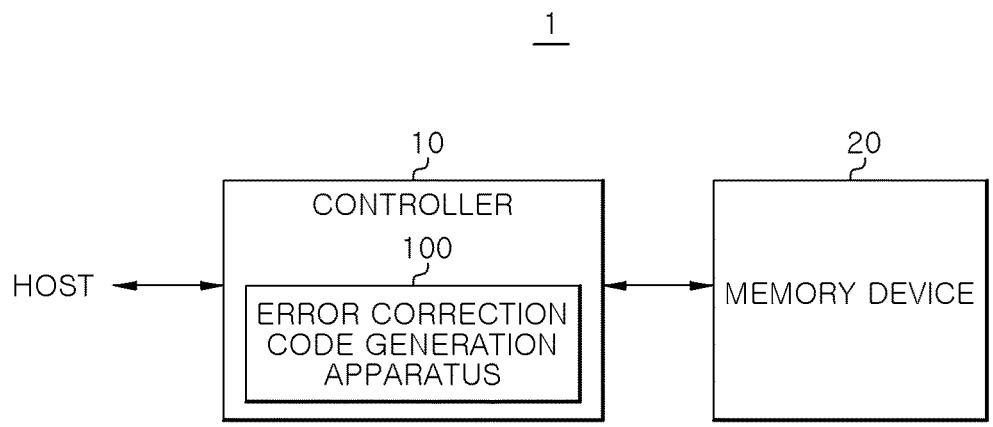
FIG. 1 is a schematic block diagram of a computing system 1 including an error correction code generation apparatus 100 according to an embodiment of the present disclosure.

The advantages and features of the embodiments and the methods of accomplishing the embodiments will be clearly understood from the following description taken in conjunction with the accompanying drawings. However, embodiments are not limited to those embodiments described, as embodiments may be implemented in various forms. It should be noted that the present embodiments are provided to make a full disclosure and also to allow those skilled in the art to know the full range of the embodiments. Therefore, the embodiments are to be defined only by the scope of the appended claims.

Terms used in the present specification will be briefly described, and the present disclosure will be described in detail.

In terms used in the present disclosure, general terms currently as widely used as possible while considering functions in the present disclosure are used. However, the terms may vary according to the intention or precedent of a technician working in the field, the emergence of new technologies, and the like. In addition, in certain cases, there are terms arbitrarily selected by the applicant, and in this case, the meaning of the terms will be described in detail in the description of the corresponding invention. Therefore, the terms used in the present disclosure should be defined based on the meaning of the terms and the overall contents of the present disclosure, not just the name of the terms.

When it is described that a part in the overall specification "includes" a certain component, this means that other components may be further included instead of excluding other components unless specifically stated to the contrary.

In addition, a term such as a "unit" or a "portion" used in the specification means a software component or a hardware component such as FPGA or ASIC, and the "unit" or the "portion" performs a certain role. However, the "unit" or the "portion" is not limited to software or hardware. The "portion" or the "unit" may be configured to be in an addressable storage medium, or may be configured to reproduce one or more processors. Thus, as an example, the "unit" or the "portion" includes components (such as software components, object-oriented software components, class components, and task components), processes, functions, properties, procedures, subroutines, segments of program code, drivers, firmware, microcode, circuits, data, database, data structures, tables, arrays, and variables. The functions provided in the components and "unit" may be combined into a smaller number of components and "units" or may be further divided into additional components and "units".

Hereinafter, the embodiment of the present disclosure will be described in detail with reference to the accompanying drawings so that those of ordinary skill in the art may easily implement the present disclosure. In the drawings, portions not related to the description are omitted in order to clearly describe the present disclosure.

Terms used for reference in describing embodiments of the present disclosure are summarized as follows.

Original data: Data to be read and written. When an error occurs, an error correction code is used to correct the error.

Codeword: Data created by adding additional data to original data.

Noise: A factor that transforms data.

Error correction code (ECC): A technique for protecting original data when an error occurs and thus original data is transformed when additional data is added to the original data.

Linear block code: A code in which a set of codewords forms a linear vector space.

Redundancy bit/parity bit: Data additionally attached to original data in error correction code.

Encoding: A process of adding redundancy (extra, duplicate) bits to original data.

Decoding: A process of correcting errors in transformed data to restore original data.

Systematic code: A code in which original data and redundancy bits are separated.

Generator matrix: A matrix that generates codewords by adding additional data to original data.

Parity check matrix (PCM, H-matrix): A matrix that creates a syndrome through operations with codewords.

Syndrome: Only pattern used for error checking. The location of an error can be ascertained through a decoding process using the syndrome and the parity check matrix.

Shortened code: A code in which the length of redundancy bits in a codeword is maintained and only the length of original data is reduced. This allows use of error correction code that meets actual memory specifications.

Reed-Solomon code: A code capable of correcting errors based on a cyclic code belonging to a linear block code. It is encoded in units of symbol rather than units of bits and can correct multiple errors occurring within a symbol.

Single symbol correction code: A code having the ability to correct a single symbol error occurring in a codeword. There are two main properties of a parity check matrix that satisfies this. First, all columns of the parity check matrix are non-zero. Second, the sums of arbitrary columns in the symbol unit of the parity check must all be different. Here, the sum of columns refers to an exclusive bit OR. For example, if the parity check matrix has 32 columns and 8 bits each form one symbol, 255 random sums of the first to eighth columns, 255 random sums of the ninth to sixteenth columns, 255 random sums of the seventeenth to the twenty-fourth column, and 255 random sums of twenty-fifth to thirty-second columns, and a total of 1020 must all be different. Since the single symbol correction code can correct all errors in a single symbol, it is currently widely used as an error correction code inside memory controllers in fields that require high reliability. However, there are limitations to high reliability because it is vulnerable to errors that do not occur in a single symbol but are scattered.

Double error correction code: It has the ability to correct two errors regardless of whether the errors occur within a single symbol when the errors occur in a codeword. Therefore, it can correct errors that cannot be corrected with single symbol correction code. There are three main properties of the parity check matrix that satisfies this. First, all columns of the parity check matrix are nonzero. Second, all columns of the parity check matrix must be different and are nonzero. Third, the exclusive bit OR of any two columns of the parity check matrix must be all different and must be different from all columns of the parity check matrix. However, it does not provide strong protection because it is vulnerable to triple errors or more that occur within a single symbol.

Some of the existing techniques can correct single symbol errors using some non-zero syndromes, but cannot correct other double errors. The shortened single symbol error code does not use syndromes except for some syndromes used for single symbol errors in nonzero syndromes for error correction.

Accordingly, in an embodiment of the present disclosure, an error correction code generation technique for improving error correction capability without adding redundancy bits (parity bits) which are extra bits by using a non-zero syndrome for double error correction without adding redundancy bits is proposed.

Hereinafter, embodiments of the present disclosure will be described in detail with reference to the attached drawings.

FIG. 1 is a schematic block diagram of a computing system 1 including an error correction code generation apparatus 100 according to an embodiment of the present disclosure.

As shown in FIG. 1, the computing system 1 may include a controller 10 and a memory device 20, and the controller 10 may include the error correction code generation apparatus 100 according to an embodiment of the present disclosure.

The controller 10 provides data to be written to the memory device 20 and stores the data in the memory device 20. Additionally, the controller 10 may receive data read from the memory device 20 and provide the data to a host (not shown).

The host which is not shown transmits a command to the controller 10 to cause the controller 10 to write data to the memory device 20 or to read data from the memory device 20 and transmit the data to the host. In other words, the controller 10 accesses the memory device 20 based on a command from the host and performs an operation corresponding to the command. The host can be connected to the controller 10 through a host interface (not shown), and the host interface allows transmission and reception of control commands, addresses, and data signals between the host and the controller 10. Depending on an embodiment, the host interface may include, but is not limited to, aerial Advanced Technology Attachment (ATA), parallel ATA, SCSI, and PCI-Express.

Here, the controller 10 may provide data to be written to the memory device 20 or may read specific data from the memory device 20 and receive the same as read data according to a command from the host. However, when data stored in the memory device 20 is read again, ideally the read data matches the written data, but there are cases where the read data and the written data do not match.

Therefore, it is necessary to provide a means for error correction to determine whether data that needs to be written has been written accurately and whether read data matches the written data, and to generate an error correction code to correct errors.

In an embodiment of the present disclosure, columns corresponding to the number of symbols in a codeword is extracted from a parity check matrix of an unshortened Reed-Solomon error correction code, a shortened parity check matrix for the Reed-Solomon error correction code is generated on the basis of the extracted columns, it is checked whether the shortened parity check matrix includes an independent nonzero syndrome for each of a single symbol error case and a double error case, and a parity check matrix for single symbol error correction and double error correction which corresponds to the number of bits of the shortened parity check matrix is generated if the shortened parity check matrix includes an independent nonzero syndrome for each of a single symbol error case and a double error case, thereby generating code for single error correction and double error correction.

Figure 2:
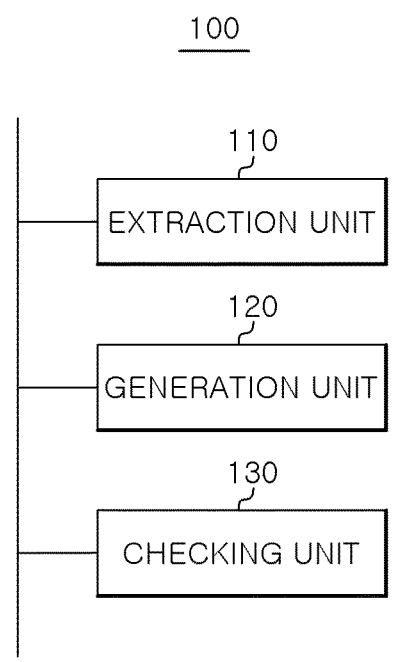
FIG. 2 is a block diagram illustrating functions of the error correction code generation apparatus 100 according to an embodiment of the present disclosure.

FIG. 2 is a block diagram illustrating functions of the error correction code generation apparatus 100 according to an embodiment of the present disclosure.

As shown in FIG. 2, the error correction code generation apparatus 100 may include an extraction unit 110, a generation unit 120, and a checking unit 130.

The extraction unit 110 may extract columns corresponding to the number of symbols of a codeword from a parity check matrix of an unshortened Reed-Solomon error correction code.

Figure 3:
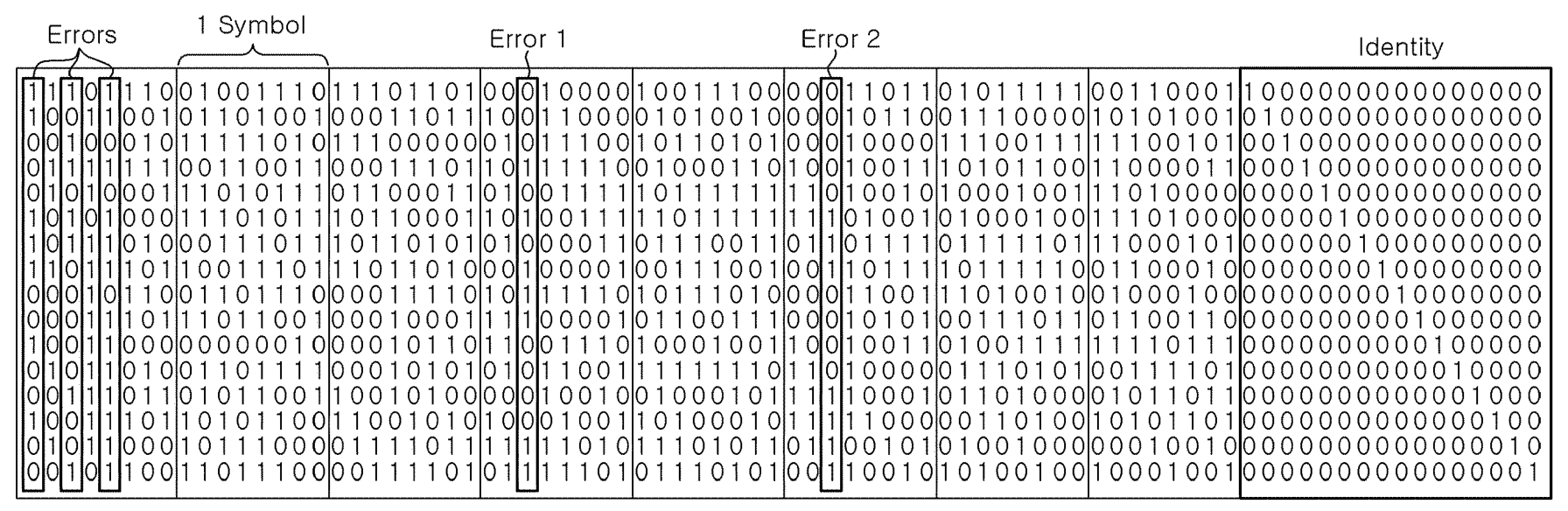

FIG. 3 is a diagram illustrating an exemplary parity check matrix of an error correction code used in the error correction code generation apparatus 100 according to an embodiment of the present disclosure. It is assumed that each symbol is composed of 8 bits in the error correction code shown in FIG. 3.

As illustrated in FIG. 3, the codeword is 80 bits long and is composed of 10 symbols including a unit matrix portion. Additionally, the codeword is composed of 64-bit original data and 16-bit redundancy. As a correctable error pattern, the exclusive bit OR of columns of the parity check matrix and syndromes that occur in the case of single symbol errors and double errors can be compared, allowing single symbol errors and double errors to be corrected.

For example, the case indicated by Errors in FIG. 3 shows that an error occurs only in the first symbol and that errors occur in the first, third, and fifth bits within the symbol. In this case, the syndrome can be expressed as (1010_0110_0101_0010) through the exclusive bit OR of (1100_0111_0010_0100), (1011_0110_0000_1001), and (1101_0111_0111_1111).

As another example, the case indicated by Error1 and Error2 in FIG. 3 shows a double error that does not occur in a single symbol. The syndrome can be expressed as (0001_0010_1100_1100) through the exclusive bit OR of (0001_0101_1100_0011) and (0000_0111_0000_1111). Additionally, the last two symbols denoted as Identity exist as a unit matrix to display a systematic code form.

Once the parity check matrix is determined in error correction code, a generation matrix corresponding thereto is identified. Then, each piece of original data is encoded into a different codeword through a generation matrix having a systematic code form. In conclusion, the error correction code can be represented by a parity check matrix.

The present disclosure defines a parity check matrix with the following conditions, and FIG. 3 is an example.

1) All columns are non-zero. 2) All columns must be different. 3) The exclusive bit ORs of arbitrary columns within an arbitrary symbol must be different. 4) The exclusive bit ORs of arbitrary two columns that are not present in one symbol must be different from each other, and must be different from the exclusive bit OR of some columns within an arbitrary symbol. Therefore, a parity check matrix having these general properties is the gist of the present disclosure.

FIG. 4 is a diagram illustrating an unshortened Reed-Solomon error correction code used in the error correction code generation apparatus 100 according to an embodiment of the present disclosure.

As described above, the extraction unit 110 may extract columns corresponding to the number of symbols of the codeword from the parity check matrix of the unshortened Reed-Solomon error correction code.

The generation unit 120 may generate a shortened parity check matrix for the Reed-Solomon error correction code on the basis of the columns extracted by the extraction unit 110.

FIG. 5 illustrates a case of extracting columns from a parity check matrix of an unshortened Reed-Solomon error correction code through the extraction unit 110 of the error correction code generation apparatus 100 according to an embodiment of the present disclosure, and a case of generating a shortened parity check matrix for the Reed-Solomon error correction code through the generation unit 120 on the basis of the extracted columns.

Here, when the generation unit 120 generates a shortened parity check matrix, the generation unit 120 may set the two rightmost columns of the parity check matrix as a unit matrix.

In FIG. 5, the parity check matrix of the unshortened Reed-Solomon error correction code may be, for example, 2040 bits, and the parity check matrix of the shortened Reed-Solomon error correction code may be, for example, 80 bits.

The checking unit 130 may check whether the shortened parity check matrix generated through the generation unit 120 includes an independent nonzero syndrome for each of a single symbol error case and a double error case.

Therefore, if the checking unit 130 checks that the shortened parity check matrix includes an independent nonzero syndrome for each of a single symbol error case and a double error case, the generation unit 120 may generate a parity check matrix for single symbol error correction and double error correction which corresponds to the number of bits of the shortened parity check matrix. That is, the extraction unit 110 may extract columns until the checking unit 130 checks that the shortened parity check matrix includes an independent nonzero syndrome for each of a single symbol error case and a double error case.

Here, the checking unit 130 may convert the symbols of each column of the shortened parity check matrix generated through the generation unit 120 into a binary form.

FIG. 6 is a diagram illustrating a case in which the symbols in a column shown in FIG. 5 are converted into a binary form.

FIG. 6 is a diagram showing symbols of al of FIG. 4 are converted into binary when primitive polynomial=$x^5+x^6+x^i+x^3+x^2+x^1+1$. The columns are represented as $\alpha^1$, $\alpha^2$, $\alpha^3$, $\alpha^4$, $\alpha^5$, $\alpha^6$, $\alpha^7$, $\alpha^8$ in order from the left column.

FIG. 7 is a diagram illustrating a parity check matrix for single symbol error correction and double error correction generated by the error correction code generation apparatus 100 according to an embodiment of the present disclosure.

FIG. 7 shows a parity check matrix in a case in which a symbol is composed of 8 bits, and is the same as FIG. 3. In this case, the codeword length is 80 bits (10 symbols), original data is 64 bits (8 symbols), and redundancy is 16 bits (2 symbols). In a case in which the parity check matrix includes a unique nonzero syndrome as a result of checking through the checking function of the checking unit 130, the generation unit 120 can generate a parity check matrix of error correction code satisfying symbol error correction and double error correction.

Hereinafter, along with the above-described configuration, a code generation method for single symbol error correction and double error correction according to an embodiment of the present disclosure will be described in detail.

FIGS. 8 to 12 are diagrams illustrating a code generation process for single symbol error correction and double error correction in the error correction code generation apparatus 100 according to an embodiment of the present disclosure.

The code generation method for single symbol error correction and double error correction according to an embodiment of the present disclosure includes a first step of extracting columns corresponding to the number of symbols of a codeword from a parity check matrix of an unshortened Reed-Solomon error correction code, a second step of generating a shortened parity check matrix for the Reed-Solomon error correction code on the basis of the columns, a third step of checking whether the shortened parity check matrix includes an independent nonzero syndrome for each of a single symbol error and a double error, and a fourth step of generating a parity check matrix for single symbol error correction and double error correction corresponding to the number of bits of the shortened parity check matrix if the shortened parity check matrix includes an independent nonzero syndrome for each of a single symbol error and a double error.

As shown in FIG. 8, in the first and second steps, columns may be extracted from the parity check matrix of the unshortened Reed-Solomon error correction code one by one (in a case in which a parity check matrix satisfying single symbol error correction and double error correction is generated when each symbol is 8 bits and the codeword is 80 bits), and a shortened parity check matrix for the Reed-Solomon error correction code may be generated on the basis of the columns.

Here, as shown in FIG. 9, two columns on the right can be set as a unit matrix. This is for generating a systematic code. Similarly, FIG. 9 illustrates a case in which a parity check matrix satisfying single symbol error correction and double error correction is generated when each symbol is 8 bits and the codeword is 80 bits.

Figure 10:
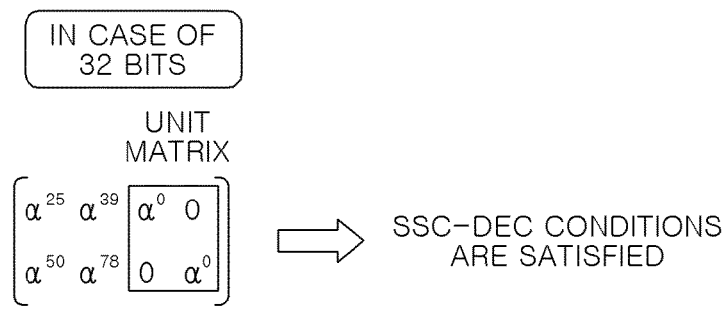

As shown in FIG. 10, in the third step, it can be checked whether the parity check matrix of FIG. 9 has a unique nonzero syndrome for each of a single symbol error and a double error. Similarly, FIG. 10 illustrates a case in which a parity check matrix satisfying single symbol error correction and double error correction is generated when each symbol is 8 bits and the codeword is 80 bits.

Figure 11:
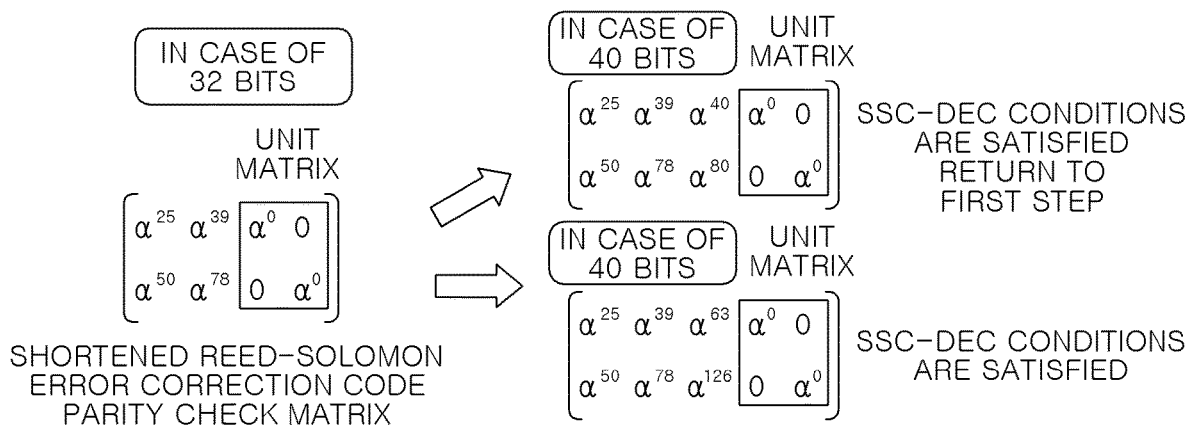
Figure 12:
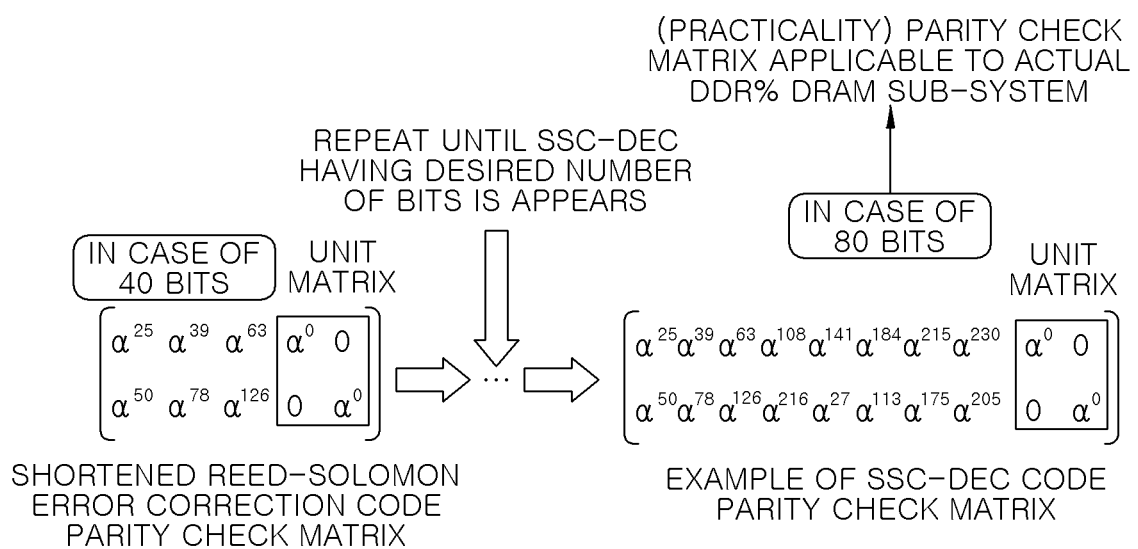

As shown in FIGS. 11 and 12, in the fourth step, the process can be fed back to the first step and repeat the steps if the parity check matrix does not include a unique nonzero syndrome. Similarly, FIGS. 11 and 12 illustrate a case in which a parity check matrix satisfying single symbol error correction and double error correction is generated when each symbol is 8 bits and the codeword is 80 bits.

Feedback to the first step can be repeated until a single symbol error code and a double error codes having a desired number of bits are obtained.

According to the embodiment of the present disclosure as described above, it is possible to minimize hardware limitations of the encoding/decoding devices and improve error correction capability by providing an error correction code capable of single symbol error correction and double error correction without adding redundancy bits.

Table 1 shows a numerical comparison between a conventional single symbol error correction technique and the code generation technique capable of single symbol error correction and double error correction according to an embodiment of the present disclosure.

TABLE 1

|  | Single symbol error correction | Single symbol error correction and double error correction |
|---|---|---|
| Number of redundancy bits | 16 | 16 |
| Redundancy bit burden | 25% | 25% |
| Number of correctable error patterns | 2,550 | 5,430 |

As can be ascertained from Table 1, according to the code generation technique for single symbol error correction and double error correction according to an embodiment of the present disclosure, the number of correctable error patterns is approximately doubled while maintaining the same number of redundancy bits as that of the conventional single symbol error correction technique.

Combinations of steps in each flowchart attached to the present disclosure may be executed by computer program instructions. Since the computer program instructions can be mounted on a processor of a general-purpose computer, a special purpose computer, or other programmable data processing equipment, the instructions executed by the processor of the computer or other programmable data processing equipment create a means for performing the functions described in each step of the flowchart. The computer program instructions can also be stored on a computer-usable or computer-readable storage medium which can be directed to a computer or other programmable data processing equipment to implement a function in a specific manner. Accordingly, the instructions stored on the computer-usable or computer-readable recording medium can also produce an article of manufacture containing an instruction means which performs the functions described in each step of the flowchart. The computer program instructions can also be mounted on a computer or other programmable data processing equipment. Accordingly, a series of operational steps are performed on a computer or other programmable data processing equipment to create a computer-executable process, and it is also possible for instructions to perform a computer or other programmable data processing equipment to provide steps for performing the functions described in each step of the flowchart.

In addition, each step may represent a module, a segment, or a portion of codes which contains one or more executable instructions for executing the specified logical function(s). It should also be noted that in some alternative embodiments, the functions mentioned in the steps may occur out of order. For example, two steps illustrated in succession may in fact be performed substantially simultaneously, or the steps may sometimes be performed in a reverse order depending on the corresponding function.

The above description is merely exemplary description of the technical scope of the present disclosure, and it will be understood by those skilled in the art that various changes and modifications can be made without departing from original characteristics of the present disclosure. Therefore, the embodiments disclosed in the present disclosure are intended to explain, not to limit, the technical scope of the present disclosure, and the technical scope of the present disclosure is not limited by the embodiments. The protection scope of the present disclosure should be interpreted based on the following claims and it should be appreciated that all technical scopes included within a range equivalent thereto are included in the protection scope of the present disclosure.

What is claimed is:

1. A processor-implemented code generation method to be performed in an error correction code generation apparatus, the code generation method comprising:
    extracting, by an extraction unit, columns corresponding to the number of symbols of a codeword from a parity check matrix of an error correction code;
    generating, by a generation unit, a shortened parity check matrix for the error correction code on the basis of the columns corresponding to the number of symbols of the codeword;
    checking, by a checking unit, whether the shortened parity check matrix includes an independent nonzero syndrome for each of a single symbol error and a double error; and
    in response to the shortened parity check matrix including the independent nonzero syndrome for each of the single symbol error and the double error, further generating, by the generation unit, a parity check matrix for a correction of the single symbol error corresponding to the number of bits of the shortened parity check matrix and a correction of the double error corresponding to the number of bits of the shortened parity check matrix.

2. The code generation method of claim 1, wherein the generating of the shortened parity check matrix includes setting two rightmost columns of the parity check matrix as a unit matrix.

3. The code generation method of claim 1, further comprising:
    determining, by the extraction unit, the checked result for whether the shortened parity check matrix includes the independent nonzero syndrome for each of the single symbol error and the double error, and repeating the extracting columns until it is checked that the shortened parity check matrix includes the independent nonzero syndrome for each of the single symbol error and the double error.

4. The code generation method of claim 1, wherein the checking of whether the shortened parity check matrix includes the independent nonzero syndrome for each of the single symbol error and the double error includes converting symbols of each column of the shortened parity check matrix into a binary form.

5. The code generation method of claim 1, wherein the correction of the double error satisfies a first condition in which all columns of the parity check matrix are nonzero and different from each other and a second condition in which exclusive bit ORs of arbitrary two columns of the parity check matrix are different from each other and are different from all columns of the parity check matrix.

6. The code generation method of claim 1, wherein each symbol is composed of 8 bits, and the codeword is composed of 80 bits.

7. The code generation method of claim 1, wherein the error correction code includes a Reed-Solomon error correction code.

8. An error correction code generation apparatus, the apparatus comprising:
    an extraction unit configured to extract columns corresponding to the number of symbols of a codeword from a parity check matrix of an error correction code;
    a generation unit configured to generate a shortened parity check matrix for the error correction code on the basis of the columns corresponding to the number of symbols of the codeword; and
    a checking unit configured to check whether the shortened parity check matrix includes an independent nonzero syndrome for each of a single symbol error and a double error,
    in response to the shortened parity check matrix including the independent nonzero syndrome for each of the single symbol error and the double error, the generation unit is further configured to generate a parity check matrix for a correction of the single symbol error corresponding to the number of bits of the shortened parity check matrix and a correction of the double error corresponding to the number of bits of the shortened parity check matrix.

9. The error correction code generation apparatus of claim 8, wherein the generation unit is further configured to set two rightmost columns of the parity check matrix as a unit matrix when generating the shortened parity check matrix.

10. The error correction code generation apparatus of claim 8, wherein the extraction unit is further configured to determine the checked result for whether the shortened parity check matrix includes the independent nonzero syndrome for each of the single symbol error and the double error, and repeatedly extract the columns until it is checked that the shortened parity check matrix includes the independent nonzero syndrome for each of the single symbol error and the double error.

11. The error correction code generation apparatus of claim 8, wherein the checking unit is further configured to convert symbols of each column of the shortened parity check matrix into a binary form.

12. The error correction code generation apparatus of claim 8, wherein the correction of the double error satisfies a first condition in which all columns of the parity check matrix are nonzero and different from each other and a second condition in which exclusive bit ORs of arbitrary two columns of the parity check matrix are different from each other and are different from all columns of the parity check matrix.

13. The error correction code generation apparatus of claim 8, wherein each symbol is composed of 8 bits, and the codeword is composed of 80 bits.

14. The error correction code generation apparatus of claim 8, wherein the error correction code includes a Reed-Solomon error correction code.

15. A non-transitory computer-readable storage medium storing a computer program including instructions for causing a processor to perform a code generation method, the code generation method comprising:

extracting columns corresponding to the number of symbols of a codeword from a parity check matrix of an error correction code;
  generating a shortened parity check matrix for the error correction code on the basis of the columns corresponding to the number of symbols of the codeword;
  checking whether the shortened parity check matrix includes an independent nonzero syndrome for each of a single symbol error and a double error; and
  in response to the shortened parity check matrix including the independent nonzero syndrome for each of the single symbol error and the double error, generating a parity check matrix for a correction of the single symbol error corresponding to the number of bits of the shortened parity check matrix and a correction of the double error corresponding to the number of bits of the shortened parity check matrix.

16. The non-transitory computer-readable storage medium of claim 15, wherein the generating of the shortened parity check matrix includes setting two rightmost columns of the parity check matrix as a unit matrix.

17. The non-transitory computer-readable storage medium of claim 15, wherein the code generation method further comprises determining the checked result for whether the shortened parity check matrix includes the independent nonzero syndrome for each of the single symbol error and the double error, and repeating the extracting columns until it is checked that the shortened parity check matrix includes the independent nonzero syndrome for each of the single symbol error and the double error.

18. The non-transitory computer-readable storage medium of claim 15, wherein the checking whether the shortened parity check matrix includes the independent nonzero syndrome for each of the single symbol error and the double error includes converting symbols of each column of the shortened parity check matrix into a binary form.

19. The non-transitory computer-readable storage medium of claim 15, wherein the correction of the double error satisfies a first condition in which all columns of the parity check matrix are nonzero and different from each other and a second condition in which exclusive bit ORs of arbitrary two columns of the parity check matrix are different from each other and are different from all columns of the parity check matrix.

20. The non-transitory computer-readable storage medium of claim 15, wherein each symbol is composed of 8 bits, and the codeword is composed of 80 bits.

* * * * *